United States Patent
Nakabayashi et al.

(10) Patent No.: US 11,662,406 B2
(45) Date of Patent: May 30, 2023

(54) MAGNETIC RESONANCE IMAGING APPARATUS AND METHOD OF CONTROLLING SUPERCONDUCTING MAGNET

(71) Applicant: Canon Medical Systems Corporation, Otawara (JP)

(72) Inventors: Kazuto Nakabayashi, Nasushiobara (JP); Takehiro Shibuya, Nasushiobara (JP)

(73) Assignee: Canon Medical Systems Corporation, Otawara (JP)

( * ) Notice: Subject to any disclaimer, the term of this patent is extended or adjusted under 35 U.S.C. 154(b) by 19 days.

(21) Appl. No.: 17/519,944

(22) Filed: Nov. 5, 2021

(65) Prior Publication Data

US 2022/0146611 A1 May 12, 2022

(30) Foreign Application Priority Data

Nov. 9, 2020 (JP) .............................. JP2020-186599

(51) Int. Cl.
*G01R 33/3815* (2006.01)
*H01F 6/02* (2006.01)
*H01F 6/04* (2006.01)

(52) U.S. Cl.
CPC .......... *G01R 33/3815* (2013.01); *H01F 6/02* (2013.01); *H01F 6/04* (2013.01)

(58) Field of Classification Search
CPC ... G01R 33/3815; G01R 33/3804; H01F 6/02; H01F 6/04; H01F 6/006
See application file for complete search history.

(56) References Cited

U.S. PATENT DOCUMENTS

| | | | |
|---|---|---|---|
| 8,385,033 B2 | 2/2013 | Gebhardt et al. | |
| 8,542,015 B2 | 9/2013 | Lvovsky et al. | |
| 10,107,880 B2 | 10/2018 | Aley et al. | |
| 10,411,460 B2 | 9/2019 | Jonas et al. | |
| 2005/0111159 A1* | 5/2005 | Knight | G01R 33/3815 361/143 |
| 2008/0088311 A1* | 4/2008 | Nakabayashi | G01R 33/3804 324/320 |

FOREIGN PATENT DOCUMENTS

JP WO 2014/199793 A1 12/2014
WO WO 2014/049501 A1 4/2014

* cited by examiner

*Primary Examiner* — Susan S Lee

(74) *Attorney, Agent, or Firm* — Oblon, McClelland, Maier & Neustadt, L.L.P.

(57) ABSTRACT

According to one embodiment, a MRI apparatus determines a first time during which a subsidiary power supply is capable of supplying power to a cooling device based on a capacity of the subsidiary power supply when power outage of a main power supply occurs, and determines a second time needed to demagnetize a superconducting magnet based on an excitation current of the superconducting magnet and a temperature of the superconducting magnet. The MRI apparatus determines starts ramp-down of the superconducting magnet after a third time based on the first time and the second time has elapsed from initiation of power outage of the main power supply.

14 Claims, 7 Drawing Sheets

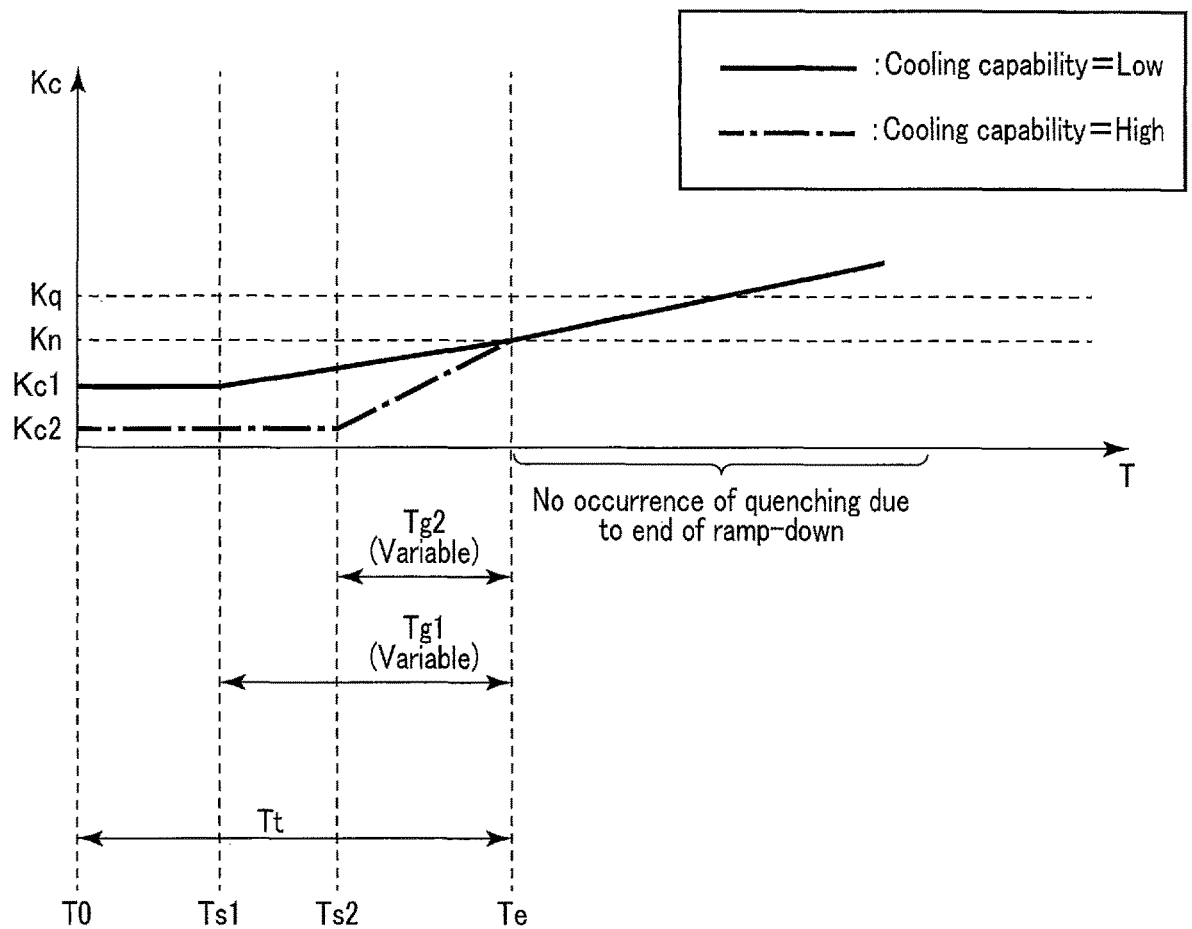
F I G. 6

MAGNETIC RESONANCE IMAGING APPARATUS AND METHOD OF CONTROLLING SUPERCONDUCTING MAGNET

CROSS-REFERENCE TO RELATED APPLICATIONS

This application is based upon and claims the benefit of priority from Japanese Patent Application No. 2020-186599, filed Nov. 9, 2020, the entire contents of which are incorporated herein by reference.

FIELD

Embodiments described herein relate generally to a magnetic resonance imaging apparatus and a method of controlling a superconducting magnet.

BACKGROUND

A superconducting magnetic resonance imaging apparatus uses helium as a coolant. In recent years, helium has become more and more expensive, putting pressure on the lifetime cost of magnetic resonance imaging apparatuses. To reduce the lifetime cost of magnetic resonance imaging apparatuses, it is effective to reduce the volume of a coolant as much as possible.

However, if a magnet cooling system fails to operate during power outage due to an unexpected accident such as a natural disaster or lightning, reducing the volume of a coolant causes quenching to occur earlier due to an increase in the internal temperature of a superconducting magnet.

BRIEF DESCRIPTION OF THE DRAWINGS

FIG. 6 is a diagram showing a temporal transition of the internal temperature of the superconducting magnet of a small-volume coolant type during power outage, occurring when an adaptive ramp-down method is used.

DETAILED DESCRIPTION

A magnetic resonance imaging apparatus according to an embodiment includes: a superconducting magnet configured to generate a static magnetic field; a cooling device configured to cool the superconducting magnet; a main power supply configured to supply power to the cooling device; a subsidiary power supply configured to supply power to the cooling device during power outage of the main power supply; processing circuitry configured to determine a first time during which the subsidiary power supply is capable of supplying power to the cooling device based on a capacity of the subsidiary power supply when power outage of the main power supply occurs, obtain a temperature of the superconducting magnet, and determine a second time needed to demagnetize the superconducting magnet based on an excitation current of the superconducting magnet and the temperature; and a ramp-down unit configured to start ramp-down (demagnetization) of the superconducting magnet after a third time based on the first time and the second time has elapsed from initiation of power outage of the main power supply.

Hereinafter, embodiments of the magnetic resonance imaging apparatus and the method of controlling the superconducting magnet will be described with reference to the accompanying drawings. The term "superconducting" used herein is synonymous with "super electrical conduction".

Figure 1:
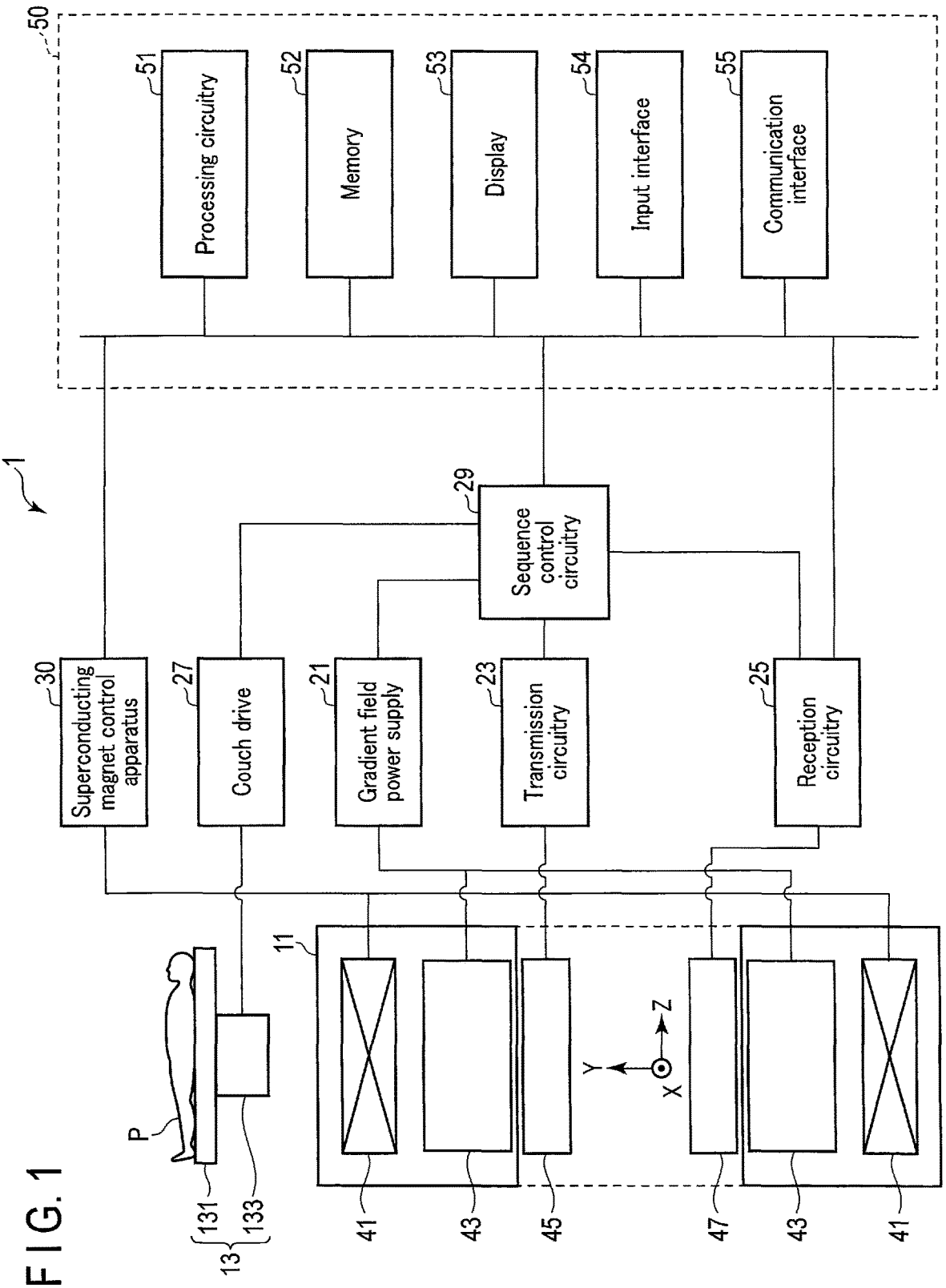
FIG. 1 is a diagram showing a configuration example of a magnetic resonance imaging apparatus according to the present embodiment.

FIG. 1 is a diagram showing a configuration example of a magnetic resonance imaging apparatus 1 according to the present embodiment. As shown in FIG. 1, the magnetic resonance imaging apparatus 1 includes a gantry 11, a couch 13, a gradient field power supply 21, transmission circuitry 23, reception circuitry 25, a couch drive 27, sequence control circuitry 29, a superconducting magnet control apparatus 30, and a host computer 50.

The gantry 11 includes a superconducting magnet 41 and a gradient magnetic field coil 43. The superconducting magnet 41 and the gradient magnetic field coil 43 are accommodated in the housing of the gantry 11. A bore in a hollow shape is formed in the housing of the gantry 11. A transmitter coil 45 and a receiver coil 47 are arranged in the bore of the gantry 11.

The superconducting magnet 41 has a hollow and substantially cylindrical shape and generates a static magnetic field thereinside. Here, the central axis of the superconducting magnet 41 is defined as a Z-axis, the axis vertically orthogonal to the Z-axis is defined as a Y-axis, and the axis horizontally orthogonal to the Z-axis is defined as an X-axis. The X-axis, the Y-axis and the Z-axis constitute an orthogonal three-dimensional coordinate system.

The gradient magnetic field coil 43 is a coil unit attached to the inside of the superconducting magnet 41 and formed in a hollow and substantially cylindrical shape. The gradient magnetic field coil 43 generates a gradient magnetic field upon receiving a current supplied from the gradient field power supply 21. Specifically, the gradient magnetic field coil 43 includes three coils corresponding to the X-axis, the Y-axis, and the Z-axis, which are orthogonal to each other. The three coils form gradient magnetic fields in which the magnetic field intensity varies along the X-axis, the Y-axis, and the Z-axis, respectively. The gradient magnetic fields along the X-axis, the Y-axis, and the Z-axis are combined to form, in desired directions, a slice selection gradient magnetic field Gs, a phase encoding gradient magnetic field Gp, and a frequency encoding gradient magnetic field Gr, which are orthogonal to each other. The slice selection gradient magnetic field Gs is used to discretionarily determine an imaging slice. The phase encoding gradient magnetic field Gp is used to change the phase of a magnetic resonance signal (hereinafter referred to as an "MR signal") in accordance with a spatial position. The frequency encoding gradient magnetic field Gr is used to change the frequency of an MR signal in accordance with a spatial position. In the following description, it is assumed that the gradient direction of the slice selection gradient magnetic field Gs aligns with the Z-axis, the gradient direction of the phase encoding gradient magnetic field Gp aligns with the Y-axis, and the gradient direction of the frequency encoding gradient magnetic field Gr aligns with the X-axis.

The gradient field power supply 21 supplies a current to the gradient magnetic field coil 43 in accordance with a sequence control signal from the sequence control circuitry 29. Through the supply of the current to the gradient magnetic field coil 43, the gradient field power supply 21 makes the gradient magnetic field coil 43 generate gradient magnetic fields along the X-axis, the Y-axis, and the Z-axis. The gradient magnetic fields are superimposed on the static magnetic field formed by the superconducting magnet 41 and are applied to a subject P.

The transmitter coil 45 is disposed, for example, inside the gradient magnetic field coil 43, and generates a high-frequency pulse (hereinafter, referred to as an "RF pulse") upon receiving a current supplied from the transmission circuitry 23.

The transmission circuitry 23 supplies a current to the transmitter coil 45 in order to apply an RF pulse for exciting a target proton in the subject P to the subject P via the transmitter coil 45. The RF pulse oscillates at a resonance frequency specific to the target proton to excite the target proton. An MR signal is generated from the excited target proton and is detected by the receiver coil 47. The transmitter coil 45 is, for example, a whole-body coil (WB coil). The whole-body coil may be used as a transmitter-receiver coil.

The receiver coil 47 receives the MR signal emitted from the target proton in the subject P in response to an action of the RF magnetic field pulse. The receiver coil 47 includes a plurality of receiver coil elements capable of receiving an MR signal. The received MR signal is supplied to the reception circuitry 25 via wire or wirelessly. Although not shown in FIG. 1, the receiver coil 47 includes a plurality of reception channels arranged in parallel. Each reception channel includes a receiver coil element which receives an MR signal, an amplifier which amplifies an MR signal, and the like. An MR signal is output from each reception channel. The total number of reception channels may be equal to, larger than, or smaller than the total number of receiver coil elements.

The reception circuitry 25 receives an MR signal generated from the excited target proton via the receiver coil 47. The reception circuitry 25 processes the received MR signal to generate a digital MR signal. The digital MR signal can be expressed in k-space defined by a spatial frequency. Therefore, the digital MR signal will be hereinafter referred to as k-space data. The k-space data is a type of raw data used for image reconstruction. The k-space data is supplied to the host computer 50 via wire, or wirelessly.

The transmitter coil 45 and the receiver coil 47 described above are merely examples. Instead of the transmitter coil 45 and the receiver coil 47, a transmitter-receiver coil which has both a transmitting function and a receiving function may be used. Alternatively, the transmitter coil 45, the receiver coil 47, and the transmitter-receiver coil may be combined.

The couch 13 is placed adjacent to the gantry 11. The couch 13 includes a top plate 131 and a base 133. The subject P is placed on the top plate 131. The base 133 supports the top plate 131 slidably along each of the X-axis, the Y-axis, and the Z-axis. The couch drive 27 is accommodated in the base 133. The couch drive 27 moves the top plate 131 under the control of the sequence control circuitry 29. The couch drive 27 may include, for example, any motor such as a servo motor or a stepping motor.

The sequence control circuitry 29 includes, as hardware resources, a processor such as a central processing unit (CPU) or a micro processing unit (MPU), and a memory such as a read only memory (ROM) or a random access memory (RAM). The sequence control circuitry 29 synchronously controls the gradient field power supply 21, the transmission circuitry 23, and the reception circuitry 25 based on the imaging conditions set by the processing circuitry 51, executes MR imaging on the subject P in accordance with a pulse sequence corresponding to the imaging conditions, and collects k-space data relating to the subject P.

The superconducting magnet control apparatus 30 is a mechanical system which controls the superconducting magnet 41. The superconducting magnet control apparatus 30 controls cooling, excitation, ramp-down, etc., of the superconducting magnet 41. The superconducting magnet control apparatus 30 will be detailed later.

As shown in FIG. 1, the host computer 50 is a computer including processing circuitry 51, a memory 52, a display 53, an input interface 54, and a communication interface 55.

The processing circuitry 51 includes, as a hardware resource, a processor such as a CPU. The processing circuitry 51 functions as the core of the magnetic resonance imaging apparatus 1. For example, the processing circuitry 51 automatically or manually sets the imaging conditions. The processing circuitry 51 reconstructs an MR image relating to the subject P based on the k-space data collected via the reception circuitry 25. The processing circuitry 51 can also perform various types of processing such as rendering, image recognition, and image analysis on the MR image.

The memory 52 is a storage device, such as a hard disk drive (HDD), a solid state drive (SSD), or an integrated circuit storage device, which stores various types of information. The memory 52 may be, for example, a CD-ROM drive, a DVD drive, or a drive which reads and writes various types of information from and in a portable storage medium such as a flash memory. For example, the memory 52 stores imaging conditions, k-space data, an MR image, a control program, etc.

The display 53 displays various types of information. For example, the display 53 displays an MR image, an imaging condition setting screen, etc. As the display 53, for example, a CRT display, a liquid crystal display, an organic EL display, an LED display, a plasma display, or any other display known in the relevant technical field may be used as appropriate.

The input interface 54 includes an input device that receives various commands from the user. Examples of the input device that can be used include a keyboard, a mouse, various switches, a touch screen, and a touch pad. The input device is not limited to those provided with physical operational components such as a mouse and a keyboard. Examples of the input interface 54 also include electrical signal processing circuitry that receives an electrical signal corresponding to an input operation from an external input device provided separately from the magnetic resonance imaging apparatus 1, and outputs the received electrical signal to various types of circuitry. The input interface 54 may also be a voice recognition device which receives voice signals via a microphone and convert the voice signals into command signals.

The communication interface 55 is an interface which connects the magnetic resonance imaging apparatus 1 with a workstation, a picture archiving and communication system (PACS), a hospital information system (HIS), a radiology information system (RIS), and the like via a local area network (LAN) or the like. The network IF transmits and receives various types of information to and from the connected workstation, PACS, HIS, and RIS.

The above configuration is merely an example, to which the present embodiment is not limited. For example, the sequence control circuitry 29 may be incorporated into the host computer 50. The sequence control circuitry 29 and the processing circuitry 51 may also be mounted on the same substrate.

Figure 2:
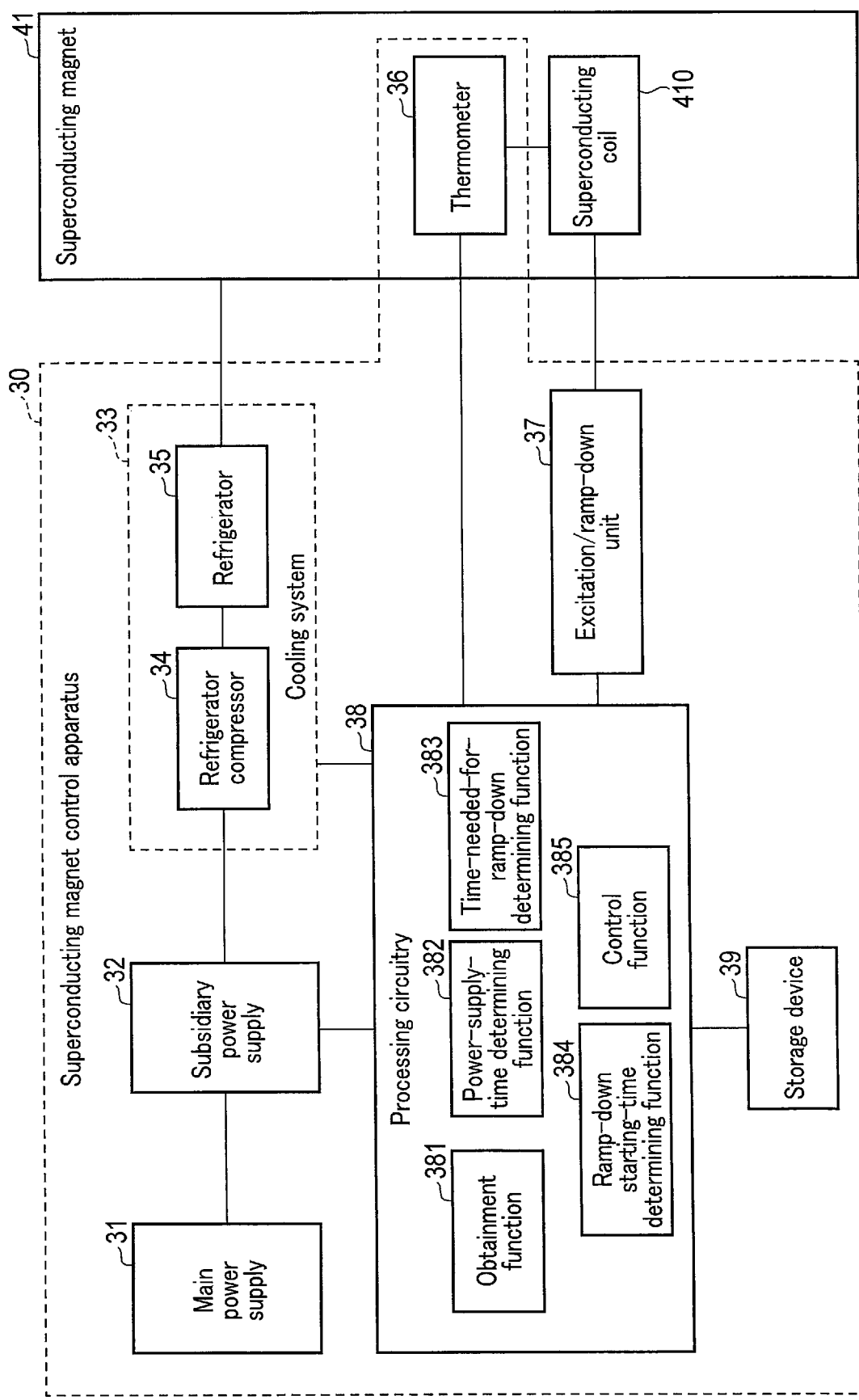
FIG. 2 is a diagram showing a configuration example of a superconducting magnet control apparatus and a superconducting magnet.

FIG. 2 is a diagram showing a configuration example of the superconducting magnet control apparatus 30 and the superconducting magnet 41. As shown in FIG. 2, the superconducting magnet 41 includes a superconducting coil 410 having a substantially cylindrical shape. The superconducting coil 410 is accommodated in a cooling container such as a cryostat (not shown). The cooling container contains a coolant such as liquid helium. The superconducting coil 410 is cooled by the coolant. Specifically, the cooling container includes a first cooling layer to be maintained in a temperature zone in a first stage and a second cooling layer to be maintained in a temperature zone in a second stage. The first stage and the second stage differ from each other depending on the type of the coolant and the like. The temperature in the first stage is, for example, approximately 40 K (kelvin) to 90 K, and the temperature in the second stage is a temperature for maintaining the liquid state, such as approximately 2 K to 30 K. The superconducting coil 410 is accommodated in the second cooling layer. The superconducting coil 410 is cooled to a very low temperature by the coolant to maintain the superconducting state. An excitation current flows through the superconducting coil 410, thereby forming a static magnetic field. In the excitation mode, a current is supplied from a main power supply 31 to the superconducting coil 410 via an excitation/ramp-down unit 37, and the superconducting coil 410 is separated from the main power supply 31 and switched to a normal mode, whereby a current flows to the superconducting coil 410.

As shown in FIG. 2, the superconducting magnet control apparatus 30 includes the main power supply 31, a subsidiary power supply 32, a cooling system 33, a thermometer 36, the excitation/ramp-down unit 37, processing circuitry 38, and a storage device 39.

The main power supply 31 is a power supply which supplies power to each component included in the superconducting magnet control apparatus 30. The main power supply 31 is a power supply which is regularly used at a normal time, that is, when no power outage is occurring. For example, the main power supply 31 is configured to be able to supply power to at least the cooling system 33. For example, a commercially available power supply is used as the main power supply 31.

The subsidiary power supply 32 is a power supply which supplies power to each component included in the superconducting magnet control apparatus 30. The subsidiary power supply 32 is a backup power supply used during power outage of the main power supply 31. For example, the subsidiary power supply 32 is configured to be able to supply power to at least the cooling system 33. As the subsidiary power supply 32, for example, an uninterruptible power supply (UPS) or a power generator may be used.

The cooling system 33 is a mechanical system which cools the superconducting magnet 41. The cooling mechanism of the cooling system 33 may be a water-cooling type, air-cooling type, or other cooling types. Specifically, the cooling system 33 includes a refrigerator compressor 34 and a refrigerator 35. The refrigerator compressor 34 and the refrigerator 35 are connected to each other through a circulation tube, so that a coolant such as helium circulates through the circulation tube. The refrigerator compressor 34 compresses the coolant and supplies the compressed coolant to the refrigerator 35. The refrigerator 35 uses the compressed coolant to cool the cooling container included in the superconducting magnet 41, more specifically, to cool the inside of the first cooling layer and the second cooling layer. In the case of a water-cooling type, a chiller which cools the refrigerator 35 may be provided. During power outage of the main power supply 31, the chiller receives power supplied from the subsidiary power supply 32.

The thermometer 36 measures the temperature of the superconducting magnet 41. Information regarding the measured temperature is supplied to the excitation/ramp-down unit 37 and the processing circuitry 38. The thermometer 36 is, for example, a resistance thermometer which is arranged close to the superconducting coil 410 of the superconducting magnet 41 and measures the temperature of the superconducting coil 410 by utilizing a change in the electric resistance of the thermometer caused by a change in the temperature of the superconducting coil 410. The type of the thermometer 36 is not limited to a resistance thermometer, and any thermometer which can measure the temperature of the superconducting magnet 41, such as a gas thermometer, a liquid thermometer, a thermoelectric thermometer, or an optical thermometer, may be used.

The excitation/ramp-down unit 37 is a mechanical device which excites or demagnetizes the superconducting magnet 41. For example, in the excitation mode, the excitation/ramp-down unit 37 supplies a current from the main power supply 31 to the superconducting coil 410 to excite the superconducting coil 410. In the ramp-down mode, the excitation/ramp-down unit 37 causes a current that is flowing to the superconducting coil 410 to flow into a load provided to the excitation/ramp-down unit 37, so that the current disappears. In the ramp-down mode, the excitation/ramp-down unit 37 starts demagnetizing the superconducting magnet 41 after the elapse of a third time based on a first time and a second time from the initiation of power outage of the main power supply 31.

The processing circuitry 38 includes, as a hardware resource, a processor such as a CPU. The processing circuitry 38 functions as the core of the superconducting magnet control apparatus 30. By executing various programs stored in the storage device 39, etc., the processing circuitry 38 implements an obtainment function 381, a power-supply-time determining function 382, a time-needed-for-ramp-down determining function 383, a ramp-down-starting-time determining function 384, and a control function 385. The processing circuitry 38 need not necessarily be provided to the superconducting magnet control apparatus 30 as long as it is arranged in the same power supply line as the cooling system 33, but may be provided to the superconducting magnet 41 or other devices.

With the obtainment function 381, the processing circuitry 38 obtains various types of information related to the superconducting magnet control apparatus 30 and the superconducting magnet 41. For example, the processing circuitry 38 obtains information on the temperature of the superconducting magnet 41 measured by the thermometer 36. The processing circuitry 38 may obtain information on the capacity of the subsidiary power supply 32.

With the power-supply-time determining function 382, the processing circuitry 38 determines the first time, during which the subsidiary power supply 32 is capable of supplying power to the cooling system 33, based on the capacity of the subsidiary power supply 32 when power outage of the main power supply 31 occurs. Hereinafter, the first time will be referred to as "time for the subsidiary power supply to supply power". The time for the subsidiary power supply to supply power means a power duration of the subsidiary power supply 32 or a time during which the subsidiary power supply 32 can perform a continuous operation.

With the time-needed-for-ramp-down determining function 383, the processing circuitry 38 determines the second time needed to demagnetize the superconducting magnet 41 based on the excitation current of the superconducting magnet 41 and the temperature of the superconducting magnet 41. Hereinafter, the second time will be referred to as a "time needed for ramp-down". The excitation current according to the present embodiment is a magnet current flowing to the superconducting coil 410 in order to generate a static magnetic field having a desired magnetic field intensity value. In other words, the excitation current is a magnet current flowing to the superconducting coil 410 in a normal mode. The magnet current according to the present embodiment is a current flowing to the superconducting coil 410.

With the ramp-down-starting-time determining function 384, the processing circuitry 38 determines the third time, at which ramp-down is started, based on the time for the subsidiary power supply to supply power and the time needed for ramp-down. Hereinafter, the third time will be referred to as a "ramp-down starting time".

With the control function 385, the processing circuitry 38 controls various configurations of the superconducting magnet control apparatus 30. For example, the processing circuitry 38 provides an instruction to start ramp-down to the excitation/ramp-down unit 37 after the elapse of the ramp-down starting time from the initiation of power outage of the main power supply 31, in order to start ramp-down of the superconducting magnet 41. The processing circuitry 38 controls switching between the main power supply 31 and the subsidiary power supply 32. The processing circuitry 38 also controls switching among the excitation mode, the normal mode, and the ramp-down mode of the excitation/ramp-down unit 37.

The storage device 39 is a storage device, such as an HDD, an SSD, or an integrated circuit storage device, which stores various types of information. For example, the storage device 39 stores a value of the excitation current of the superconducting magnet 41. The storage device 39 may be incorporated into the processing circuitry 38.

Hereinafter, an operation example of the magnetic resonance imaging apparatus 1 according to the present embodiment will be described.

As noted above, a superconducting magnetic resonance imaging apparatus uses helium as a coolant. In recent years, helium has become more and more expensive, putting pressure on the lifetime cost of magnetic resonance imaging apparatuses. To reduce the lifetime cost of magnetic resonance imaging apparatuses, it is effective to reduce the volume of a coolant as much as possible. However, if the cooling system 33 of the superconducting magnet 41 fails to operate during power outage due to an unexpected accident such as a natural disaster or lightning, then reduction of the volume of a coolant, or lack of a coolant in the case of conduction cooling, causes an early increase in the internal temperature of the superconducting magnet 41, resulting in earlier occurrence of quenching.

A backup of the cooling system 33 using the subsidiary power supply 32 may be adopted when power outage of the main power supply 31 occurs. However, the continuous operation time of the subsidiary power supply 32 is limited depending on the fuel or the capacity such as a charge capacity; thus, when no more capacity is left, the subsidiary power supply 32 stops, and so does the cooling system 33. When the cooling system 33 stops, the temperature of the superconducting magnet 41 increases due to a reduced amount of a coolant or lack of a coolant, resulting in an occurrence of quenching. Once a quench occurs, the energy thereof needs to be absorbed inside the superconducting magnet 41. When the volume of the coolant is small or there is no coolant, the energy cannot be released efficiently to the outside of the superconducting magnet 41, causing a significant increase in the temperature, requiring considerable cost and time for cooling when exciting the superconducting magnet 41 again.

Figure 3:
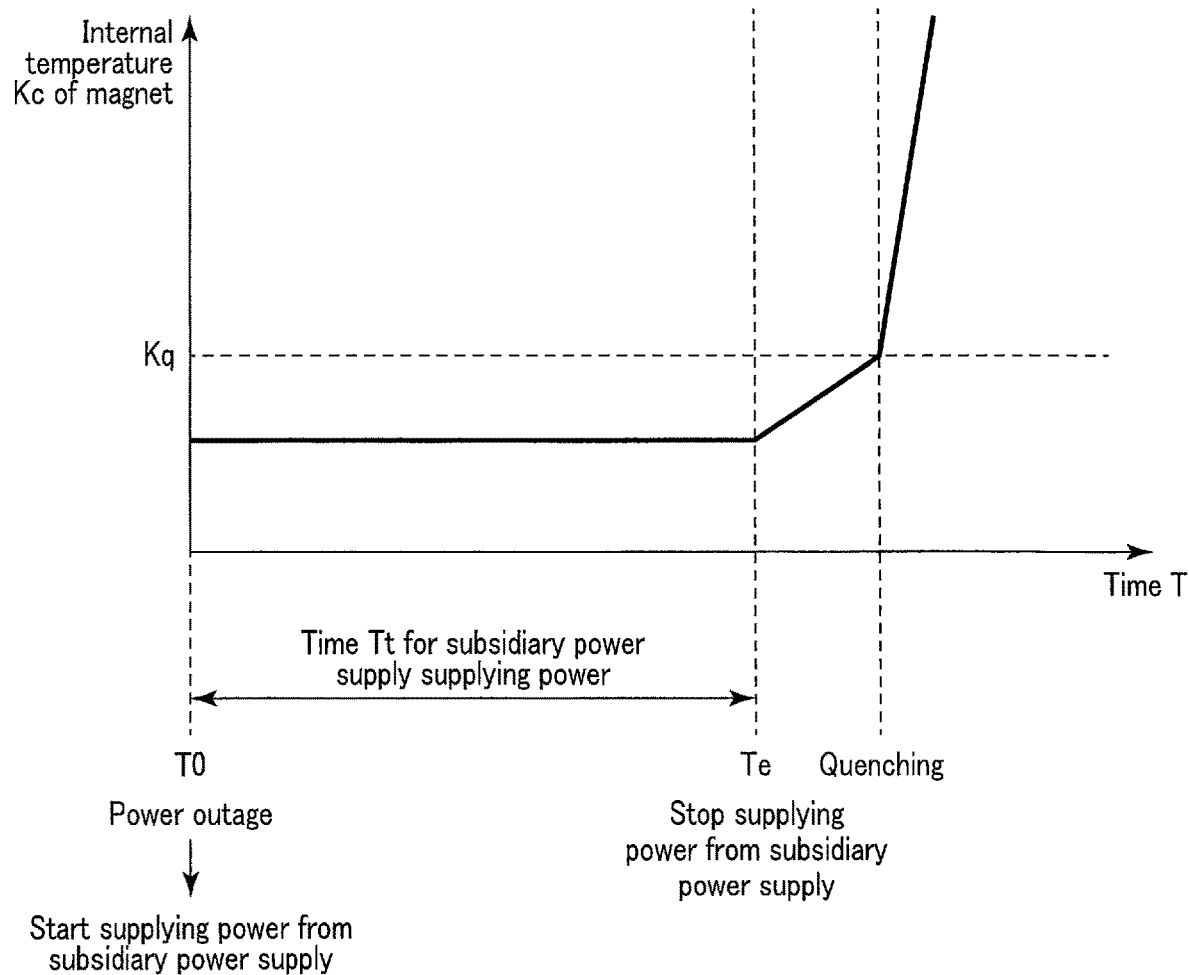
FIG. 3 is a diagram showing a temporal transition of the internal temperature of the superconducting magnet of a small-volume coolant type during power outage.

FIG. 3 is a diagram showing a temporal transition of the internal temperature Kc of the superconducting magnet 41 of a small-volume coolant type during power outage. In the graph shown in FIG. 3, the vertical axis defines an internal temperature Kc of the superconducting magnet 41, and the horizontal axis defines a time T elapsed from a time T0 when power outage of the main power supply 31 starts. As show in FIG. 3, the subsidiary power supply 32 operates when the power outage of the main power supply 31 starts. The power outage starting time T0 is substantially the same as the time when the subsidiary power supply 32 starts to supply power. Even if the power outage of the main power supply 31 starts, the internal temperature Kc does not increase because the subsidiary power supply 32 keeps supplying power to the cooling system 33. The subsidiary power supply 32 stops supplying power to the cooling system 33 at a time Te when the time Tt for the subsidiary power supply to supply power has elapsed from the power outage starting time T0. When the subsidiary power supply 32 stops supplying power to the cooling system 33, the internal temperature Kc starts to increase. When the internal temperature Kc increases, the superconducting state is disturbed locally and transitions to a normal conduction state, causing resistance, and Joule heat is generated in the resistive part and expands the normal conduction part. When there is a coolant, the Joule heat is discharged to the outside of the superconducting magnet 41 by the coolant. It is assumed that when the amount of the coolant is small or there is no coolant, the internal temperature Kc reaches a limit temperature (critical temperature) Kq at which the superconducting coil 410 can maintain its superconducting state, within approximately an hour to a day, although it depends on the amount of the coolant stored in the superconducting magnet 41. When the internal temperature Kc reaches the limit temperature Kq, the superconducting coil 410 can no longer maintain its superconducting state, causing an occurrence of quenching and a rapid increase in the internal temperature Kc. Hereinafter, the limit temperature Kq will be referred to as a "quench temperature Kq".

Once a quench occurs, a considerable number of days such as approximately several days to several weeks will be required to cool the superconducting magnet 41. If there is a large amount of coolant which absorbs heat generated by the quench, heat generation will be suppressed by the coolant, and as a result the heat will be discarded to the outside of the superconducting magnet 41; thus, an increase in the internal temperature Kc can be suppressed. However, if there is no coolant or the amount of coolant is as small as several tens of liters, the time from the initiation of power outage to the increase in the internal temperature Kc will be short; thus, suppressing or preventing an occurrence of quenching is an important objective so that reduction of the amount of coolant can be realized. As a method for achieving this objective, performing ramp-down with the excitation/ramp-down unit 37 during operation of the subsidiary power supply 32 to avoid quenching (hereinafter referred to as a "ramp-down method") would be one way.

Figure 4:
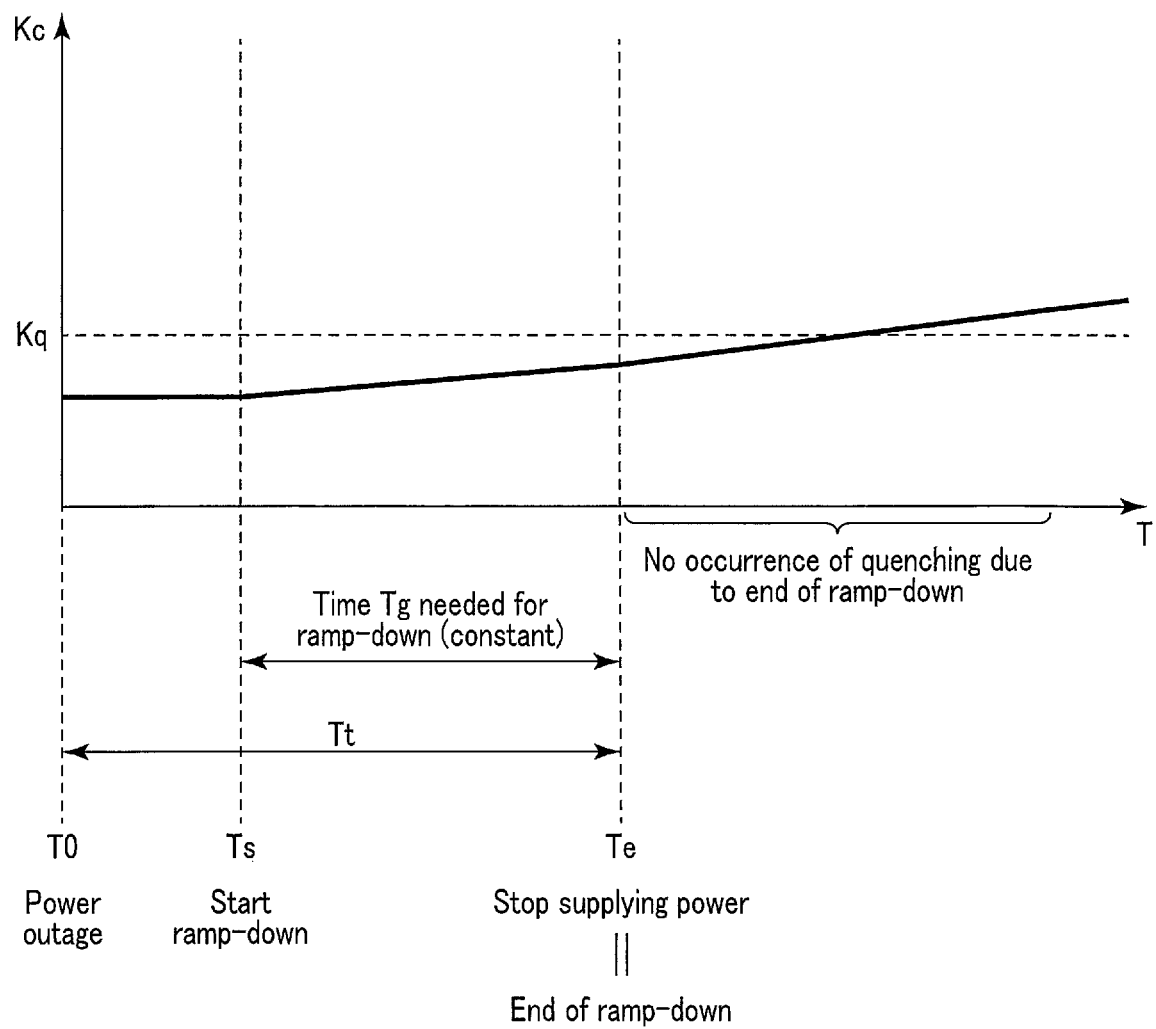
FIG. 4 is a diagram showing a temporal transition of the internal temperature of the superconducting magnet of a small-volume coolant type during power outage, occurring when a ramp-down method is used.

FIG. 4 is a diagram showing a temporal transition of the internal temperature Kc of the superconducting magnet 41 of a small-volume coolant type during power outage, occurring when the ramp-down method is used. As shown in FIG. 4, after the subsidiary power supply 32 starts to supply power, ramp-down by the excitation/ramp-down unit 37 is started from a ramp-down starting time Ts. The slight increase in the internal temperature Kc of the superconducting magnet 41 from the time Ts indicates the influence of the heat generation caused by a change in the magnetic field due to ramp-down. Appropriately setting a change in the current per unit time during ramp-down can reduce the magnet current to approximately zero before the quench temperature Kq is reached. The magnet current being zero means that there is no residual energy in the superconducting magnet 41. Therefore, even if the capacity of the subsidiary power supply 32 becomes zero afterwards to stop power supply to the cooling system 33, no large amount of heat will be generated. An increase in the internal temperature Kc after termination of ramp-down is caused by the heat entering the inside of the superconducting magnet 41 from the outside of the superconducting magnet 41 (approximately several joules or less per second), and the value of the internal temperature Kc is significantly smaller than that of a quench energy (approximately 10 M joules in the case of 3T). Therefore, even if power supply to the cooling system 33 is stopped, the internal temperature Kc can be maintained to a low temperature over a long period of time, as compared with the case where quenching has occurred.

The ramp-down starting time Ts is set to a time (Tt-Tg) obtained by subtracting the time Tg needed for ramp-down from the time Tt for the subsidiary power supply to supply power. Incidentally, the cooling capability of the refrigerator 35 degrades due to aging degradation of a member such as a sliding part or a cooling storage member. Degradation of the cooling capability increases the internal temperature Kc at the start of the operation of the subsidiary power supply 32. If the internal temperature Kc is high, quenching occurs earlier; thus, the ramp-down starting time Ts needs to be set to an earlier time. Namely, if the time Tg needed for ramp-down is fixed, it is necessary to set the ramp-down starting time Ts to start early even if there is enough cooling capability. On the other hand, if the ramp-down starting time Ts is delayed, the internal temperature Kc can be maintained to a low temperature and the magnet current can be maintained to an excitation current; thus, the time required for recovery from the power outage of the main power supply 31 can be shortened. For these reasons, the time Tg needed for ramp-down needs to be estimated accurately according to individual circumstances.

Accordingly, the magnetic resonance imaging apparatus 1 according to the present embodiment adaptively estimates a proper time Tg needed for ramp-down and/or ramp-down starting time Ts according to the internal temperature Kc of the superconducting magnet 41, and starts ramp-down at an optimal timing in consideration of both avoiding quenching and shortening the recovery time. Hereinafter, a ramp-down method based on the adaptively estimated time Tg needed for ramp-down and/or ramp-down starting time Ts will be referred to as an "adaptive ramp-down method".

Figure 5:
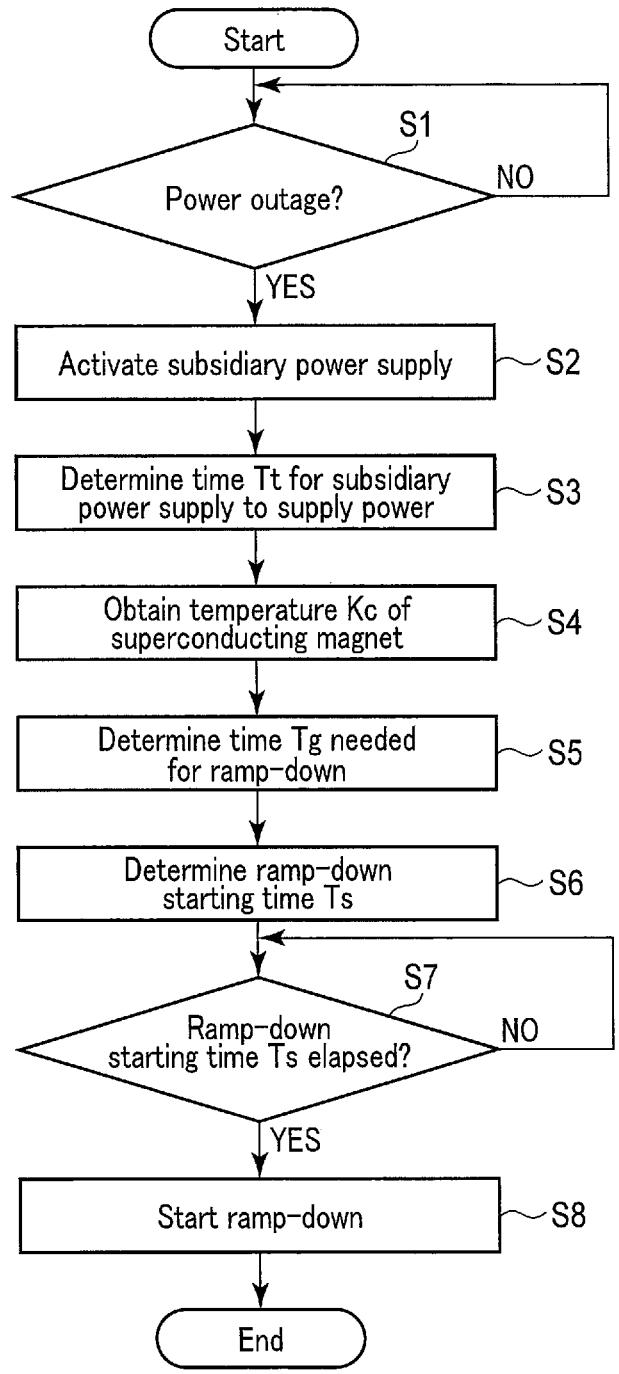
FIG. 5 is a diagram showing a flow of a processing example of controlling the superconducting magnet in association with an adaptive ramp-down method, performed by the superconducting magnet control apparatus shown in FIG. 2.

FIG. 5 is a diagram showing a flow of a processing example of controlling the superconducting magnet 41 in association with the adaptive ramp-down method, performed by the superconducting magnet control apparatus 30. FIG. 6 is a diagram showing a temporal transition of the internal temperature Kc of the superconducting magnet 41 of a small-volume coolant type during power outage, occurring when the adaptive ramp-down method is used.

As shown in FIG. 5, the processing circuitry 38 waits for the power outage of the main power supply 31 to start through the implementation of the control function 385 (step S1). When there is no occurrence of power outage, that is, at a normal time, the power from the main power supply 31 is supplied to the refrigerator compressor 34, the refrigerator 35, and the processing circuitry 38 through the subsidiary power supply 32 as an alternating current or a direct current depending on the rating of each of the refrigerator compressor 34, the refrigerator 35, and the processing circuitry 38. At a normal time, the power from the main power supply 31 may be supplied to the refrigerator compressor 34, the refrigerator 35, and the processing circuitry 38 without bypassing the subsidiary power supply 32. The main power supply 31 undergoes power outage due to various factors such as a natural disaster and lightning.

If the power outage of the main power supply 31 starts in step S1 (step S1: YES), the processing circuitry 38 activates the subsidiary power supply 32 through implementation of the control function 385 (step S2). When the subsidiary power supply 32 is activated, the power from the subsidiary power supply 32 is supplied to the refrigerator compressor 34, the refrigerator 35, and the processing circuitry 38 at as alternating current or a direct current depending on the rating of each of the refrigerator compressor 34, the refrigerator 35, and the processing circuitry 38. The power outage of the main power supply 31 in step S1 may be detected by other components such as the subsidiary power supply 32.

When step S2 is performed, the processing circuitry 38 determines the time Tt for the subsidiary power supply to supply power through implementation of the power-supply-time determining function 382 (step S3). In step S3, the processing circuitry 38 determines the time Tt for the subsidiary power supply to supply power based on the capacity of the subsidiary power supply 32 that allows for output when the subsidiary power supply 32 is an uninterruptible power supply, and determines the time Tt for the subsidiary power supply to supply power based on the remaining capacity of the subsidiary power supply 32 when the subsidiary power supply 32 is a power generator. Hereinafter, the capacity of the subsidiary power supply 32 that allows for output and the remaining capacity of the subsidiary power supply 32 are collectively and simply referred to as a "capacity". The capacity of the subsidiary power supply 32 is obtained from the subsidiary power supply 32 at the start of the power outage of the main power supply 31. When the capacity of the subsidiary power supply 32 at the start of the power outage of the main power supply 31 is already known, the value of the capacity of the subsidiary power supply 32 is stored in advance in the storage device 39, so that the processing circuitry 38 may obtain the value from the storage device 39 at any timing.

More specifically, the processing circuitry 38 determines the time Tt for the subsidiary power supply to supply power based on the capacity of the subsidiary power supply 32 and the power that should be supplied by the subsidiary power supply 32 during power outage of the main power supply 31. The power that should be supplied by the subsidiary power supply 32 during the power outage includes at least power that should be supplied to the cooling system 33 during the power outage. The power that should be supplied to the cooling system 33 during the power outage is equivalent to the power consumed by the cooling system 33 during the power outage, and a value of the power may be measured in advance. The value of the power that should be supplied to the cooling system 33 during the power outage is stored in the storage device 39. The power that should be supplied by the subsidiary power supply 32 during the power outage may further include power that should be supplied to the processing circuitry 38, power that should be supplied to the excitation/ramp-down unit 37, and power that should be supplied to a chiller (not shown) installed for the purpose of cooling the cooling system 33. The power that should be supplied to the processing circuitry 38, the power that should be supplied to the excitation/ramp-down unit 37, and the power that should be supplied to a chiller are equivalent to the power consumed by the processing circuitry 38, the power consumed by the excitation/ramp-down unit 37, and the power consumed by a chiller, respectively, and values of the respective power may be measured in advance and stored in the storage device 39. By taking the power supplied to components other than the cooling system 33 into consideration, the time Tt for the subsidiary power supply to supply power can be determined accurately.

When step S3 is performed, the processing circuitry 38 obtains the internal temperature Kc of the superconducting magnet 41 through implementation of the obtainment function 381 (step S4). In step S4, the processing circuitry 38 obtains, as the internal temperature Kc, information related to the temperature of the superconducting coil 410 measured by the thermometer 36 at the time T0 when power outage of the main power supply 31 starts or immediately thereafter. The thermometer 36 may be arranged at multiple locations of the superconducting coil 410 in order to increase the accuracy of the internal temperature Kc. In this case, statistics such as an average value, a minimum value, and a maximum value of the measured temperatures may be set as the internal temperature Kc. The internal temperature Kc is not limited to the temperature of the superconducting coil 410, and may be the first-stage temperature or the second-stage temperature of the refrigerator 35. The internal temperature Kc may also be the temperature of a heat shield provided to the cooling container. As described above, the processing circuitry 38 obtains the internal temperature Kc measured by one or more thermometers 36 before ramp-down by the excitation/ramp-down unit 37 is performed in step S8.

When step S4 is performed, the processing circuitry 38 determines the time Tg needed for ramp-down through implementation of the time-needed-for-ramp-down determining function 383 (step S5). In step S5, the processing circuitry 38 determines the time Tg needed for ramp-down based on the internal temperature Kc of the superconducting magnet 41 measured in step S4 and an excitation current I0 of the superconducting magnet 41. A value of the excitation current I0 is measured as a value of a magnet current I to the superconducting coil 410 needed for each superconducting coil 410 to attain a desired magnetic field intensity. The value of the excitation current I0 is measured, for each magnetic field intensity value, by performing excitation with the excitation/ramp-down unit 37 while using a magnetic field measuring instrument, such as an NMR probe, when installing the superconducting magnet 41, for example. The association of the magnetic field intensity value with the excitation current value is stored in the storage device 39 in the form of a Lookup Table (LUT), database, or the like.

Simply stated, the processing circuitry 38 determines the time Tg needed for ramp-down based on the excitation current I0 and an amount ΔI of current change. Specifically, the time Tg needed for ramp-down is determined by dividing the excitation current I0 by the amount ΔI of current change. The amount ΔI of current change is defined by an amount of change in the magnet current per unit time during the ramp-down performed by the excitation/ramp-down unit 37. As shown in FIG. 6, the amount ΔI of current change corresponds to the gradient of the internal temperature Kc during the time Tg needed for ramp-down.

For example, when the cooling capability of the cooling system 33 is low, the internal temperature at the power outage starting time T0 is defined as Kc1, and when the cooling capability of the cooling system 33 is high, the internal temperature at the power outage starting time T0 is defined as Kc2, as shown in FIG. 6. The highest temperature allowed during ramp-down (i.e., permissive temperature) Kn is set to a temperature equal to or less than the quench temperature Kq. In the case of the internal temperature Kc1, for example, the time Tg1 needed for ramp-down is calculated such that a range of an increase in the internal temperature Kc caused by heat generation in the superconducting coil 410 over the time Tg1 needed for ramp-down based on the amount ΔI1 of current change matches the difference Kn-Kc1 between the permissive temperature Kn and the internal temperature Kc1. In the case of the internal temperature Kc2, for example, the time Tg2 needed for ramp-down is calculated such that a range of an increase in the internal temperature Kc caused by heat generation in the superconducting coil 410 over the time Tg2 needed for ramp-down based on the amount Δ2 of current change matches the difference Kn-Kc2 between the permissive temperature Kn and the internal temperature Kc2.

The processing circuitry 38 may determine the time Tg needed for ramp-down based on the amount ΔI of a change per unit time in the excitation current I0, the internal temperature Kc1, and an amount ΔK of temperature change per unit time of the superconducting magnet 41. For example, the case where ramp-down starts from t=0 at the internal temperature Kc1 will be discussed for simplicity. In order to prevent quenching from occurring after the time Tg needed for ramp-down, it is necessary to satisfy, by and large, the relationship of ΔK*Tg1+Kc1<Kn including a margin. Specifically, the processing circuitry 38 determines the time Tg needed for ramp-down such that a value of a temperature increase over the time Tg needed for ramp-down based on the amount ΔK of temperature change measured in advance matches a difference value of the internal temperature Kc1 from the permissive temperature Kn as much as possible, while falling below the difference value.

The amount ΔK of temperature change is a function of the amount ΔI of current change and the internal temperature Kc, and can specifically be represented by ΔK=f(ΔI, Kc). The amount ΔK of temperature change close to the internal temperature Kc can be represented by an approximate equation, ΔK=α(Kc)ΔI, using the amount ΔI of current change. α(Kc) represents a ratio of the amount ΔK of temperature change to the amount ΔI of current change, and is measured in advance by a type test or the like. When this approximate equation is used, the above relationship can be represented by $\alpha(Kc)\Delta I^*Tg+Kc1<Kn$, and the processing circuitry 38 determines $\Delta I^*Tg1$ such that it will satisfy $\Delta I^*Tg1<(Kn-Kc1)/\alpha(Kc)$. The processing circuitry 38 determines a product $\Delta I^*Tg1$ of the amount $\Delta I$ of current change and the time Tg1 needed for ramp-down, so that it will be smaller than a value obtained by dividing the difference between the permissive temperature Kn and the internal temperature Kc1 by $\alpha(Kc)$. The processing circuitry 38 then determines the time Tg1 needed for ramp-down by dividing the product $\Delta I^*Tg1$ by the amount $\Delta I$ of current change. The amount $\Delta I$ of current change is also measured in advance by a type test or the like. When the internal temperature is Kc2 as well, the time Tg1 needed for ramp-down can be determined by the same method.

As described above, the ratio $\alpha(Kc)$ between the amount $\Delta I$ of current change and the amount $\Delta K$ of temperature change associated therewith is measured by a type test or the like and stored in the storage device 39. In the type test, while varying the amount of a change in the magnet current per unit time during ramp-down, a value of an increase in the internal temperature per unit time corresponding to said amount of current change is measured as an amount of temperature change, so that a table which records the ratio $\alpha(Kc)$ between the amount of current change and the amount of temperature change (the value of the increase in the internal temperature) is generated. The table is stored in the storage device 39. The processing circuitry 38 sets, as the amount $\Delta I$ of current change, any amount of current change in the table that would not cause the internal temperature after the temperature increase to lead to a quench. The processing circuitry 38 may set the amount $\Delta I$ of current change in advance before power outage occurs, or set the amount $\Delta I$ of current change according to the internal temperature Kc obtained in step S4. The amount $\Delta I$ of current change set in advance is stored in the storage device 39. The processing circuitry 38 also sets the ratio $\alpha(Kc)$ corresponding to the set amount $\Delta I$ of current change based on the above table. The ratio $\alpha(Kc)$ is also stored in the storage device 39.

As described above, in the case of performing ramp-down based on the amount $\Delta I$ of current change, the processing circuitry 38 determines, as the time Tg needed for ramp-down, the time required for ramp-down that would prevent a temperature from increasing to the temperature Kq at which quenching occurs due to heat generation in the superconducting coil 410.

To determine the time Tg needed for ramp-down more accurately, the processing circuitry 38 may determine the time Tg needed for ramp-down based on other elements in addition to the internal temperature Kc and the excitation current I0. For example, the processing circuitry 38 may determine the time Tg needed for ramp-down based on the excitation current I0, the internal temperature Kc, and the power of the excitation/ramp-down unit 37 that is required for ramp-down. The time Tg needed for ramp-down may be set longer if the power required for ramp-down is larger, and the time Tg needed for ramp-down may be set shorter if the power required for ramp-down is smaller. The processing circuitry 38 may also determine the time Tg needed for ramp-down based on the positions of the thermometer 36, the superconducting coil 410, and the refrigerator 35, and the amount of heat transfer among the thermometer 36, the superconducting coil 410, and the refrigerator 35, in addition to the excitation current I0 and the internal temperature Kc.

The processing circuitry 38 may also calculate the time Tg needed for ramp-down using a heat generation calculation formula related to ramp-down designed for each superconducting magnet 41, based on the internal temperature Kc, the excitation current I0, and the amount $\Delta I$ of current change. The heat generation calculation formula may incorporate various elements such as the cooling capability of the refrigerator 35, the positions of the thermometer 36, the superconducting coil 410, and the refrigerator 35, and the amount of heat transfer among the thermometer 36, the superconducting coil 410, and the refrigerator 35, described above. The cooling capability of the refrigerator 35 may be a cooling capability of the refrigerator 35 for maintaining the first-stage temperature, a cooling capability of the refrigerator 35 for maintaining the second-stage temperature, or both.

As a simple method of determining the time Tg needed for ramp-down, the processing circuitry 38 may determine the time Tg needed for ramp-down on the assumption that the amount $\Delta I$ of current change and the amount of heat generation of the superconducting coil 410 are constant irrespective of the excitation current I0 or the amount $\Delta I$ of current change. The processing circuitry 38 may also obtain a function of the heat generation calculation formula for representative parameters, such as the excitation current I0, through the type test, and infer an actual state from analogy through interpolation or the like.

When step S5 is performed, the processing circuitry 38 determines the ramp-down starting time Ts through implementation of the ramp-down-starting-time determining function 384 (step S6). For example, the processing circuitry 38 sets, as the ramp-down starting time Ts, the time Tt-Ts obtained by subtracting the time Tt for the subsidiary power supply to supply power from the time Tt for the subsidiary power supply to supply power. The processing circuitry 38 may set, as the ramp-down starting time Ts, the time obtained by loading any excess time on the time Tt-Ts obtained by subtracting the time Tt for the subsidiary power supply to supply power from the time Tt for the subsidiary power supply to supply power.

According to the present embodiment, an appropriate variable time Tg needed for ramp-down can be determined according to the internal temperature Kc during power outage. As shown in FIG. 6, the internal temperature Kc at the power outage starting time T0 is higher when the cooling capability of the cooling system 33 is low than when the cooling capability of the cooling system 33 is high. When the cooling capability is low, the internal temperature Kc is highly likely to reach the quench temperature Kq at an early stage; thus, the time Tg1 needed for ramp-down is set to relatively long, and, as such, the ramp-down starting time Ts1 is set to relatively early after the power outage starting time T0. Also, when the cooling capability is high, the internal temperature Kc is less likely to reach the quench temperature Kq at an early stage; thus, the time Tg2 needed for ramp-down is set to relatively short, and, as such, the ramp-down starting time Ts2 is set to relatively late after the power outage starting time T0.

When step S6 is performed, the processing circuitry 38 waits for the ramp-down starting time Ts to elapse through implementation of the control function 385 (step S7). In step S7, the processing circuitry 38 waits for the ramp-down starting time Ts to elapse after the power outage starting time T0.

If the ramp-down starting time Ts elapses (step S7: YES), the processing circuitry 38 controls the excitation/ramp-down unit 37 to start ramp-down through implementation of the control function 385 (step S8).

Figure 7:
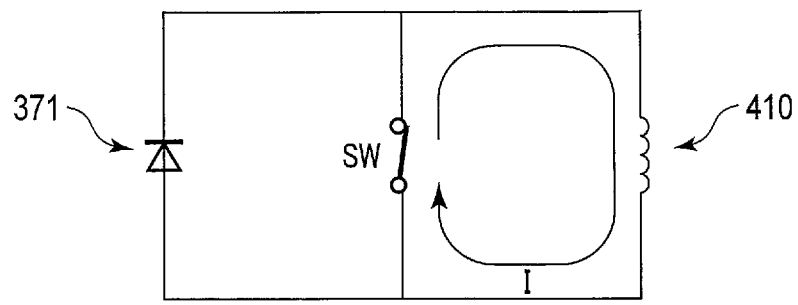
FIG. 7 is a diagram showing equivalent circuitry of an excitation/ramp-down unit and the superconducting magnet in a normal mode.
Figure 8:
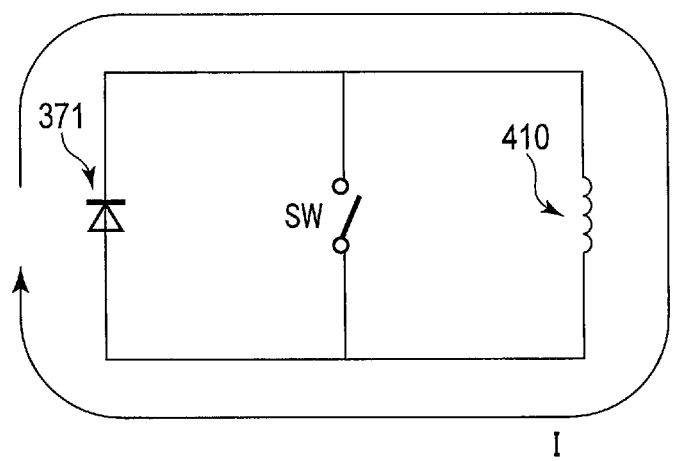
FIG. 8 is a diagram showing equivalent circuitry of an excitation/ramp-down unit and the superconducting magnet in a ramp-down mode.

FIG. 7 is a diagram showing equivalent circuitry of the excitation/ramp-down unit 37 and the superconducting magnet 41 in a normal mode (non-ramp-down mode). FIG. 8 is a diagram showing equivalent circuitry of the excitation/ramp-down unit 37 and the superconducting magnet 41 in a ramp-down mode. As shown in FIGS. 7 and 8, a superconducting coil 410 is provided to the superconducting magnet 41, a load diode 371 for ramp-down is provided to the excitation/ramp-down unit 37, and a superconducting switch SW is provided between the superconducting coil 410 and the load diode 371. The load diode 371 is an example of a load used to cause the magnet current I to flow thereinto and disappear. The superconducting switch SW is a switch for switching between the normal mode and the ramp-down mode and is arranged inside the superconducting magnet 41. The superconducting switch SW switches between ON and OFF in response to power supplied from the excitation/ramp-down unit 37.

As shown in FIG. 7, the superconducting switch SW is turned on in the normal mode, and an endless loop is formed in which the magnet current I circulates between the superconducting coil 410 and the superconducting switch SW inside the superconducting magnet 41. As shown in FIG. 8, when the excitation/ramp-down unit 37 receives an instruction to start ramp-down, the excitation/ramp-down unit 37 turns off the superconducting switch SW. When the superconducting switch SW is turned off, the superconducting state is released, so that the equivalent circuitry will be equivalent to an open state. When the superconducting switch SW is turned off, the magnet current I flows into the external excitation/ramp-down unit 37 and, in the example shown in FIG. 8, flows into the load diode 371. The excitation/ramp-down unit 37 adjusts the amount of the magnet current I flowing into the load diode 371 per unit time so as to match the amount $\Delta I$ of current change.

FIG. 8 shows only a single stage of the load diode 371 for simplicity; however, the number of stages of the load diode 371 is generally determined by a ratio $V/L=\Delta I$ of a sum V of diode forward voltage for achieving a desired ramp-down rate (amount of current change) $\Delta I$ to an inductance L of the superconducting coil 410. Although the load is a diode in FIGS. 7 and 8, it may be constituted by a current source or an electronic load.

In the above example of the load diode 371, the amount $\Delta I$ of current change during ramp-down is generally constant. However, the amount $\Delta I$ of current change need not necessarily be constant. For example, the load provided to the excitation/ramp-down unit 37 may be a constant current source that can change the amount $\Delta I$ of current change, instead of a load diode. In this case, the excitation/ramp-down unit 37 may obtain the internal temperature Kc of the superconducting coil 410 measured by the thermometer 36 during ramp-down and adjust the amount of change in the current flowing into the constant current source based on the internal temperature Kc. For example, the amount of current change may be maximized within such a range that the internal temperature Kc does not exceed the quench temperature Kq. Thereby, ramp-down can be performed in the shortest period of time. At this time, the thermometer 36 may be provided in, for example, a portion of the superconducting coil 410 where a temperature increase due to resistance is assumed to be large, in order to increase the accuracy of the internal temperature Kc. Also, multiple thermometers 36 may be provided to the superconducting coil 410 in order to increase the accuracy of the internal temperature Kc. In this case, the excitation/ramp-down unit 37 may set, as the internal temperature Kc, a statistic such as a maximum value of multiple temperatures measured by multiple thermometers 36.

As described above, the amount $\Delta I$ of current change is determined in advance based on the result of the measurement obtained by conducting the type test. If the cooling capability of the refrigerator 35 is decreased in accordance with aging degradation, performing ramp-down based on the amount $\Delta I$ of current change determined in advance will make a temperature increase per unit time larger than planned. Thus, the excitation/ramp-down unit 37 may obtain the internal temperature Kc of the superconducting coil 410 measured by the thermometer 36 during ramp-down and adjust the amount $\Delta I$ of a change in the current flowing into the constant current source based on the internal temperature Kc and the cooling capability corresponding to the aging degradation of the cooling system 33. For example, the amount of current change may be maximized within such a range that the internal temperature Kc does not exceed the quench temperature Kq. Thereby, ramp-down can be performed in the shortest period of time.

The excitation/ramp-down unit 37 may determine a permissible value of an increase in the temperature of the superconducting magnet 41 based on the residual energy of the superconducting magnet 41 during ramp-down, and adjust the amount of current change based on the permissible value. Thereby, it is also possible to further shorten the time Tg needed for ramp-down according to the residual energy during ramp-down. The residual energy of the superconducting magnet 41 is defined by $(LI^2)/2$, that is, the residual energy of the superconducting magnet 41 is proportional to the square of the magnet current I. For example, when quenching occurs in the state where the magnet current value is 1/10 of the excitation current I0, the residual energy can be reduced to 1/100, as compared to the case where quenching occurs in the state where the magnet current value is the excitation current I0.

The excitation/ramp-down unit 37 may end the ramp-down after the magnet current I disappears completely; or if there is no possibility that quenching will occur or the residual energy is sufficiently low, the excitation/ramp-down unit 37 may end the ramp-down before the magnet current I disappears completely.

When the excitation/ramp-down unit 37 ends the ramp-down, the process of controlling the superconducting magnet 41 associated with the adaptive ramp-down method, performed by the superconducting magnet control apparatus 30, is ended.

The flow of the processing shown in FIG. 5 is merely an example, and the present embodiment is not limited thereto.

For example, the excitation/ramp-down unit 37 may stop the ramp-down when restoration of power of the main power supply 31 is detected. This allows for reduction of the cost and the time needed to excite the superconducting magnet 41 again, because the ramp-down is stopped before the residual energy in the superconducting magnet 41 becomes zero. Power of the main power supply 31 may be restored by detecting a supply of power from the main power supply 31, by receiving a power restoration signal from the main power supply 31, or by receiving a notice of power restoration input via the input interface 54, etc., by a user, etc.

For example, the order of steps S3 and S4 may be switched. Namely, the time Tt for the subsidiary power supply to supply power may be determined after the internal temperature Kc is obtained.

As described above, the magnetic resonance imaging apparatus 1 includes the superconducting magnet 41, the cooling system 33, the main power supply 31, the subsidiary power supply 32, the processing circuitry 38, and the excitation/ramp-down unit 37. The superconducting magnet 41 generates a static magnetic field. The cooling system 33 cools the superconducting magnet 41. The main power supply 31 is a power supply device capable of supplying power to the cooling system 33. The subsidiary power supply 32 is a power supply device capable of supplying power to the cooling system 33 during power outage of the main power supply 31. The processing circuitry 38 determines the time for the subsidiary power supply to supply power, during which the subsidiary power supply 32 is capable of supplying power to the cooling system 33, based on the capacity of the subsidiary power supply 32 when power outage of the main power supply 31 occurs. The processing circuitry 38 obtains the temperature of the superconducting magnet 41. The processing circuitry 38 determines the time needed for ramp-down required to demagnetize the superconducting magnet 41, based on the excitation current and the temperature of the superconducting magnet 41. The excitation/ramp-down unit 37 starts demagnetizing the superconducting magnet 41 after the elapse of the ramp-down starting time, which is based on the time for the subsidiary power supply to supply power and the time needed for ramp-down, from the initiation of power outage of the main power supply 31.

According to the above configuration, an appropriate time Tg needed for ramp-down is adaptively determined according to the internal temperature Kc of the superconducting magnet 41; thus, an accurate time Tg needed for ramp-down according to individual circumstances can be estimated, and ramp-down can be started at an optimal timing in consideration of both avoiding quenching and shortening the recovery time. Accordingly, even in the case of containing a small volume of coolant, the possibility of occurrence of quenching during power outage can be reduced more reliably, and the temperature increase can be suppressed to relatively low when a quench occurs, which allows for a significant reduction of the cost and the time required for recovery. Also, since it is possible to estimate an accurate time Tg needed for ramp-down according to individual circumstances, it is possible to delay the ramp-down starting time as much as possible in such cases as when the cooling capability of the cooling system 33 is high. Accordingly, reduction of the cost and time required for performing the excitation operation again can be expected. In addition, since it is possible to realize a magnetic resonance imaging apparatus which contains a small volume of coolant, the lifetime cost can be suppressed.

According to at least one embodiment described above, it is possible to reduce the possibility of occurrence of quenching.

The term "processor" used in the above description means, for example, a CPU, a GPU, or circuitry such as an application specific integrated circuit (ASIC), a programmable logic device (e.g., a simple programmable logic device (SPLD), a complex programmable logic device (CPLD), or a field programmable gate array (FPGA)). The processor reads and executes a program stored in storage circuitry to realize its functions. Instead of storing a program in storage circuitry, the program may be directly incorporated into circuitry of the processor. In this case, the processor reads and executes the program incorporated into the circuitry to realize its functions. The functions corresponding to the program may be realized not by executing the program but by a combination of logic circuits. Each processor of the present embodiment is not limited to a configuration as a single circuit; a plurality of independent circuits may be combined into one processor to realize its functions. Furthermore, a plurality of constituent elements in FIGS. 1 and 2 may be integrated into a single processor, and may realize the respective functions thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Regarding the foregoing embodiments, the following appendage is disclosed as one aspect and selective features of the invention.

(Appendix 1)

A magnetic resonance imaging apparatus comprising:
a superconducting magnet configured to generate a static magnetic field;
a cooling device configured to cool the superconducting magnet;
a main power supply configured to supply power to the cooling device;
a subsidiary power supply configured to supply power to the cooling device during power outage of the main power supply;
processing circuitry configured to determine a first time during which the subsidiary power supply is capable of supplying power to the cooling device based on a capacity of the subsidiary power supply when power outage of the main power supply occurs, obtain a temperature of the superconducting magnet, and determine a second time needed to demagnetize the superconducting magnet based on an excitation current of the superconducting magnet and the temperature; and
a ramp-down unit configured to start ramp-down of the superconducting magnet after a third time based on the first time and the second time has elapsed from initiation of power outage of the main power supply.

(Appendix 2)

The processing circuitry may determine the first time based on a capacity of the subsidiary power supply that allows for output or a remaining capacity of the subsidiary power supply.

(Appendix 3)

The processing circuitry may determine the second time based on the excitation current, the temperature, and power required for ramp-down by the ramp-down unit.

(Appendix 4)

The subsidiary power supply may further supply power to the processing circuitry during power outage of the main power supply.

(Appendix 5)

The processing circuitry may obtain the temperature measured by one or more thermometers arranged in a structure of the superconducting magnet before the ramp-down is started.

The processing circuitry may determine the second time using the obtained temperature.

(Appendix 6)

The processing circuitry may determine the second time based on positions of the thermometer, a superconducting coil included in the superconducting magnet, and a refrigerator included in the cooling device, and an amount of heat transfer among the thermometer, the superconducting coil, and the refrigerator, in addition to the excitation current and the temperature.

(Appendix 7)

In the case where the ramp-down unit performs the ramp-down based on an amount of a change in the excitation current per unit time, the processing circuitry may determine, as the second time, a time required for the ramp-down that would prevent a temperature from increasing to a temperature at which quenching occurs due to heat generation in the superconducting magnet.

(Appendix 8)

The processing circuitry may determine the second time based on a change in the excitation current per unit time, the temperature, and a temperature change of the superconducting magnet per unit time.

(Appendix 9)

The temperature change may be measured in advance by a type test.

(Appendix 10)

The ramp-down unit may stop the ramp-down when restoration of power of the main power supply is detected.

(Appendix 11)

The processing circuitry may measure the temperature when performing the ramp-down.

The ramp-down unit may adjust an amount of a change per unit time in a current flowing from the superconducting magnet to a load included in the ramp-down unit based on the measured temperature.

(Appendix 12)

The processing circuitry may measure the temperature when performing the ramp-down.

The ramp-down unit may adjust an amount of a change per unit time in a current flowing from the superconducting magnet to a load included in the ramp-down unit based on the measured temperature and a cooling capability corresponding to aging degradation of the cooling device.

(Appendix 13)

The ramp-down unit may determine a permissible value of an increase in a temperature of the superconducting magnet based on residual energy of the superconducting magnet, and adjust an amount of a change per unit time in a current flowing to a load included in the ramp-down unit based on the permissible value.

(Appendix 14)

A method of controlling a superconducting magnet, the method comprising:

determining a first time during which a subsidiary power supply is capable of supplying power to a cooling device based on a capacity of the subsidiary power supply, when power outage of a main power supply occurs, wherein the subsidiary power supply is configured to supply power to the cooling device, and the cooling device is configured to cool a superconducting magnet;

obtaining a temperature of the superconducting magnet;

determining a second time needed to demagnetize the superconducting magnet based on an excitation current of the superconducting magnet and the temperature; and starting ramp-down of the superconducting magnet using a ramp-down unit after a third time based on the first time and the second time has elapsed from initiation of power outage of the main power supply.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of controlling a superconducting magnet, the method comprising:

determining a first time during which a subsidiary power supply is capable of supplying power to a cooling device based on a capacity of the subsidiary power supply, when power outage of a main power supply occurs, wherein the subsidiary power supply is configured to supply power to the cooling device, and the cooling device is configured to cool a superconducting magnet;

obtaining a temperature of the superconducting magnet;

determining a second time needed for a ramp-down unit to demagnetize the superconducting magnet based on an excitation current of the superconducting magnet and the temperature; and starting ramp-down of the superconducting magnet using the ramp-down unit after a third time based on the first time and the second time has elapsed from initiation of power outage of the main power supply.

2. A magnetic resonance imaging apparatus comprising:

a superconducting magnet configured to generate a static magnetic field;

a cooling device configured to cool the superconducting magnet;

a main power supply configured to supply power to the cooling device;

a subsidiary power supply configured to supply power to the cooling device during power outage of the main power supply;

processing circuitry configured to determine a first time during which the subsidiary power supply is capable of supplying power to the cooling device based on a capacity of the subsidiary power supply when power outage of the main power supply occurs, obtain a temperature of the superconducting magnet, and determine a second time needed to demagnetize the superconducting magnet based on an excitation current of the superconducting magnet and the temperature; and a ramp-down unit configured to start ramp-down of the superconducting magnet after a third time based on the first time and the second time has elapsed from initiation of power outage of the main power supply.

3. The magnetic resonance imaging apparatus according to claim 2, wherein the processing circuitry is configured to determine the first time based on a capacity of the subsidiary power supply that allows for output or a remaining capacity of the subsidiary power supply.

4. The magnetic resonance imaging apparatus according to claim 2, wherein the processing circuitry is configured to determine the second time based on the excitation current, the temperature, and power required for ramp-down by the ramp-down unit.

5. The magnetic resonance imaging apparatus according to claim 2, wherein the subsidiary power supply is configured to further supply power to the processing circuitry during power outage of the main power supply.

6. The magnetic resonance imaging apparatus according to claim 2, wherein the processing circuitry is configured to:

obtain the temperature measured by one or more thermometers arranged in a structure of the superconducting magnet before the ramp-down is started; and
determine the second time using the obtained temperature.

7. The magnetic resonance imaging apparatus according to claim 6, wherein the processing circuitry is configured to determine the second time based on positions of the thermometer, a superconducting coil included in the superconducting magnet, and a refrigerator included in the cooling device, and an amount of heat transfer among the thermometer, the superconducting coil, and the refrigerator, in addition to the excitation current and the temperature.

8. The magnetic resonance imaging apparatus according to claim 2, wherein in the case where the ramp-down is performed based on an amount of a change in the excitation current per unit time, the processing circuitry is configured to determine, as the second time, a time required for the ramp-down that would prevent a temperature from increasing to a temperature at which quenching occurs due to heat generation in the superconducting magnet.

9. The magnetic resonance imaging apparatus according to claim 2, wherein the processing circuitry is configured to determine the second time based on a change in the excitation current per unit time, the temperature, and a temperature change of the superconducting magnet per unit time.

10. The magnetic resonance imaging apparatus according to claim 9, wherein the temperature change is measured in advance by a type test.

11. The magnetic resonance imaging apparatus according to claim 2, wherein the ramp-down unit is configured to stop the ramp-down when restoration of power of the main power supply is detected.

12. The magnetic resonance imaging apparatus according to claim 2, wherein the processing circuitry is configured to measure the temperature when performing the ramp-down, and the ramp-down unit is configured to adjust an amount of a change per unit time in a current flowing from the superconducting magnet to a load included in the ramp-down unit based on the measured temperature when performing the ramp-down.

13. The magnetic resonance imaging apparatus according to claim 2, wherein the processing circuitry is configured to measure the temperature when performing the ramp-down, and the ramp-down unit is configured to adjust an amount of a change per unit time in a current flowing from the superconducting magnet to a load included in the ramp-down unit based on the measured temperature and a cooling capability corresponding to aging degradation of the cooling device.

14. The magnetic resonance imaging apparatus according to claim 2, wherein the ramp-down unit is configured to determine a permissible value of an increase in a temperature of the superconducting magnet based on residual energy of the superconducting magnet, and adjust an amount of a change per unit time in a current flowing to a load included in the ramp-down unit based on the permissible value.

* * * * *